(12) United States Patent
Saxod et al.

(10) Patent No.: US 10,483,181 B2
(45) Date of Patent: Nov. 19, 2019

(54) ELECTRONIC PACKAGE AND FABRICATION METHOD

(71) Applicant: STMicroelectronics (Grenoble 2) SAS, Grenoble (FR)

(72) Inventors: Karine Saxod, Les Marches (FR); Nicolas Mastromauro, Lumbin (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 16/035,083

(22) Filed: Jul. 13, 2018

(65) Prior Publication Data

US 2019/0027416 A1    Jan. 24, 2019

(30) Foreign Application Priority Data

Jul. 18, 2017  (FR) ...................... 17 56798

(51) Int. Cl.

| | |
|---|---|
| *H01L 23/12* | (2006.01) |
| *H01L 23/31* | (2006.01) |
| *H01L 23/32* | (2006.01) |
| *H01L 23/04* | (2006.01) |
| *H01L 23/10* | (2006.01) |

(52) U.S. Cl.
CPC .......... *H01L 23/3142* (2013.01); *H01L 23/04* (2013.01); *H01L 23/10* (2013.01); *H01L 23/315* (2013.01); *H01L 23/3114* (2013.01); *H01L 23/32* (2013.01)

(58) Field of Classification Search
CPC ..... H01L 23/10; H01L 23/04; H01L 23/3114; H01L 23/3142; H01L 23/315; H01L 23/32

USPC .......................................................... 257/704
See application file for complete search history.

(56) References Cited

U.S. PATENT DOCUMENTS

| | | | | |
|---|---|---|---|---|
| 6,819,566 | B1 * | 11/2004 | Danovitch | .......... H01L 23/3128 |
| | | | | 257/706 |
| 8,164,676 | B2 * | 4/2012 | Tian | ..................... H04N 5/2257 |
| | | | | 348/340 |
| 8,592,959 | B2 * | 11/2013 | Fujii | ..................... H01L 23/055 |
| | | | | 257/664 |
| 2011/0127655 | A1 | 6/2011 | Fujii | |
| 2013/0286565 | A1 | 10/2013 | Tsuduki et al. | |

OTHER PUBLICATIONS

INPI Search Report and Written Opinion for FR 1756798 dated Jun. 1, 2018 (7 pages).

* cited by examiner

*Primary Examiner* — Luan C Thai
(74) *Attorney, Agent, or Firm* — Crowe & Dunlevy

(57) ABSTRACT

An integrated circuit chip is mounted to a front face of a support plate. An encapsulation cap in then mounted to the support plate. The encapsulation cap includes a front wall and a peripheral wall having an end edge at least partly facing a peripheral zone of the support plate. The support plate and the encapsulation cap delimit a chamber in which the integrated circuit chip is situated. To mount the encapsulation cap, a bead of glue is inserted between the peripheral zone and the end edge of the peripheral wall of the encapsulation cap. A peripheral outer face of the encapsulation cap includes a recess extending from the end edge which locally uncovers a part of the bead of glue. A local hardening of the glue at the recess is performed as a first attachment step. Further hardening of the remainder of the glue is then performed.

21 Claims, 3 Drawing Sheets

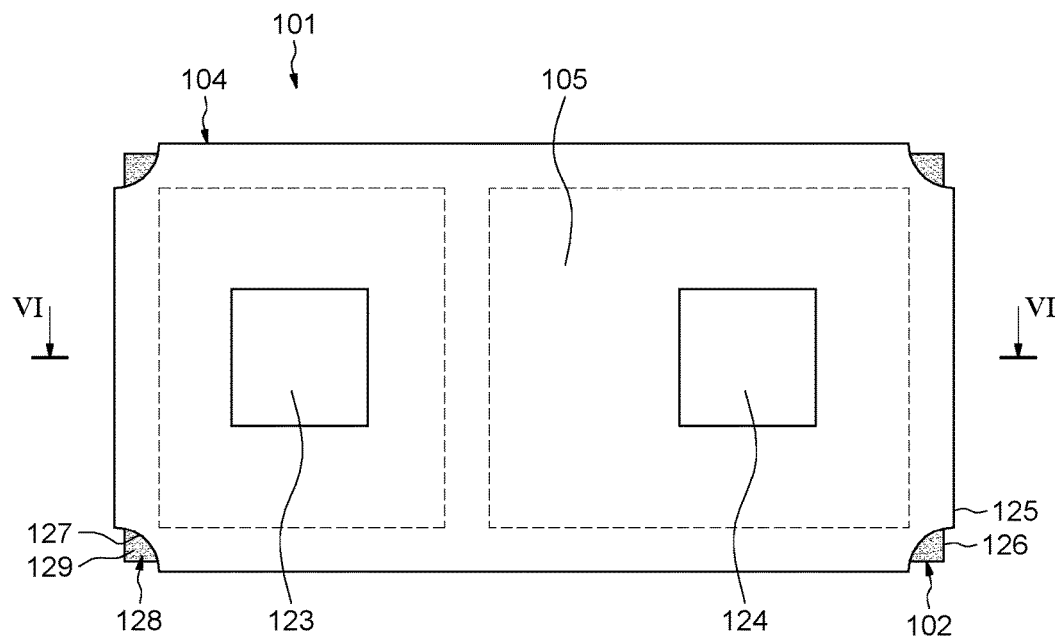
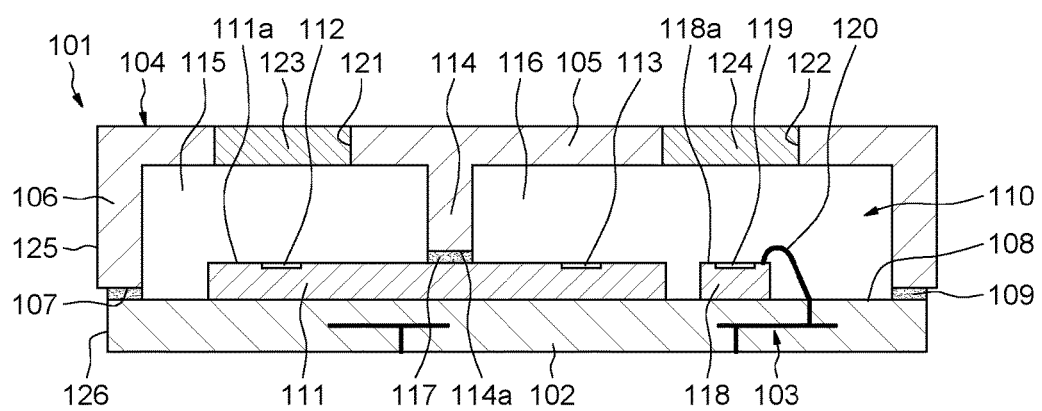

ELECTRONIC PACKAGE AND FABRICATION METHOD

PRIORITY CLAIM

This application claims the priority benefit of French Application for Patent No. 1756798, filed on Jul. 18, 2017, the content of which is hereby incorporated by reference in its entirety to the maximum extent allowable by law.

TECHNICAL FIELD

Embodiments of the present invention relate to the field of packages, in particular those intended to contain electronic integrated circuit chips that can be referred to, for example, as "electronic packages".

SUMMARY

In an embodiment, a package comprises: a support plate having a front face; at least one electronic integrated circuit chip mounted on the front face of the support plate; an encapsulation cap comprising a front wall extending in front of the electronic integrated circuit chip and a peripheral wall having an end edge at least partly facing a peripheral zone of the support plate, the support plate and the encapsulation cap delimiting at least one chamber in which the electronic integrated circuit chip is situated; and at least one bead of glue inserted between said peripheral zone of the support plate and said end edge of the peripheral wall of the encapsulation cap.

The peripheral outer face of said encapsulation cap has at least one local hollowed-out recess extending from said end edge and along a local and limited portion of said peripheral wall in the peripheral direction of the peripheral wall, said at least one local recess locally uncovering said bead of glue in a local portion of the bead of glue in the peripheral direction of the peripheral wall.

Said local recess can extend over all the height of said peripheral outer face of said encapsulation cap.

Said local recess can extend over a part of the height of said peripheral outer face of said encapsulation cap.

The peripheral outer face of said encapsulation cap can have at least two local recesses situated opposite one another.

The peripheral outer face of said encapsulation cap can have local recesses situated in the corners of this cap.

The peripheral outer face of the encapsulation cap can be situated beyond the peripheral edge of the support plate.

The front face of the chip has at least one optical member and the front wall of the encapsulation cap has a through passage provided with an optical element capable of being passed through by light.

Also proposed is a method for fabricating a package comprising a support plate, an encapsulation cap having a front wall and a peripheral wall and at least one electronic integrated circuit chip. The method comprises the following steps: fixing said chip onto a front face of said support plate; depositing a bead of glue over at least a part of a peripheral zone of said front face of the support plate; placing said encapsulation cap on top of said support plate, in a position such that an end edge of said peripheral wall is placed at least partly on said bead of glue and at least one local point of said bead of glue is uncovered; locally hardening the bead of glue by means of a first equipment item, at the point of said local recess; and totally hardening the bead of glue by means of a second equipment item.

The peripheral face of the cap can have at least one local recess extending from said end edge and capable of determining said uncovered local point.

Said glue can be capable of hardening under the effect of a light radiation and of heat and the first equipment item can be capable of emitting a light radiation towards said local point of the bead of glue, via said local recess, and said second equipment item is a bake oven.

The placement of said encapsulation cap on top of said support plate can be performed by a transfer and holding tool which bears said first hardening equipment item.

BRIEF DESCRIPTION OF THE DRAWINGS

Electronic packages will now be described by way of nonlimiting exemplary embodiments, illustrated by the drawing in which:

FIG. 5 represents a plan view of another package; and

FIG. 6 represents a transverse cross section, according to VI-VI, of the package of FIG. 5.

DETAILED DESCRIPTION

Figure 1:
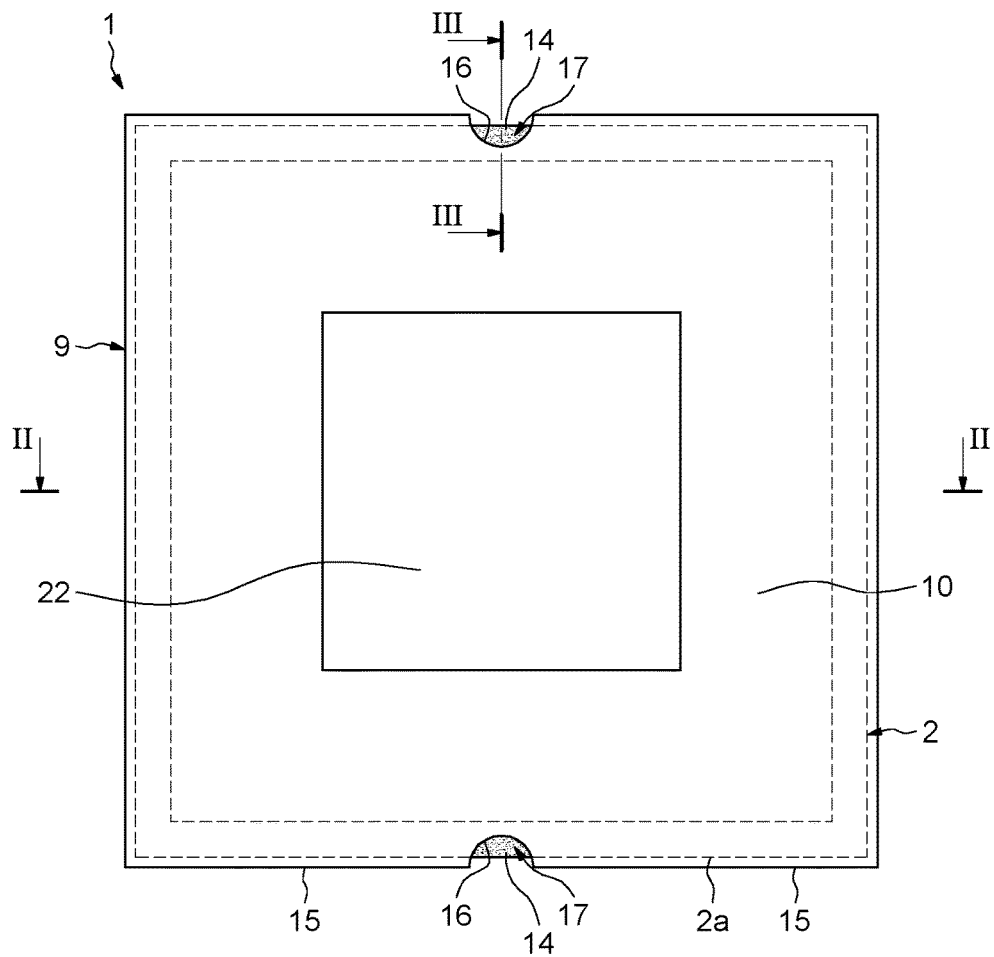
FIG. 1 represents a plan view of a package.
Figure 2:
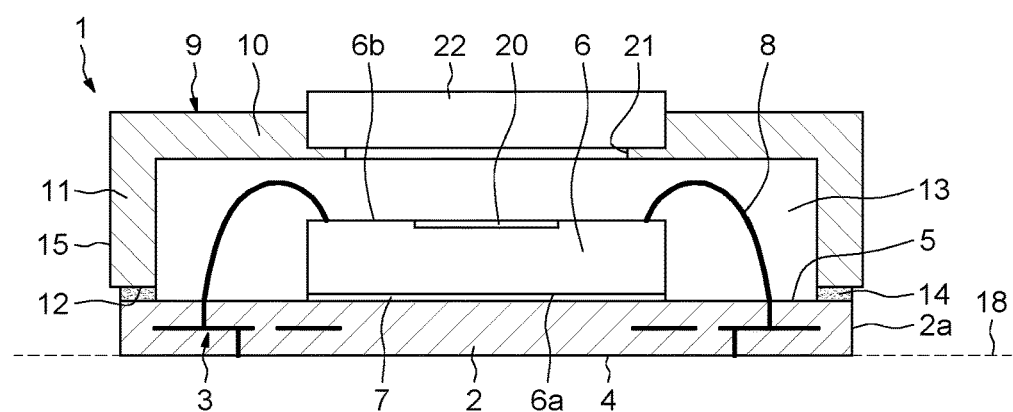
FIG. 2 represents a transverse cross section, according to II-II, of the package of FIG. 1.
Figure 3:
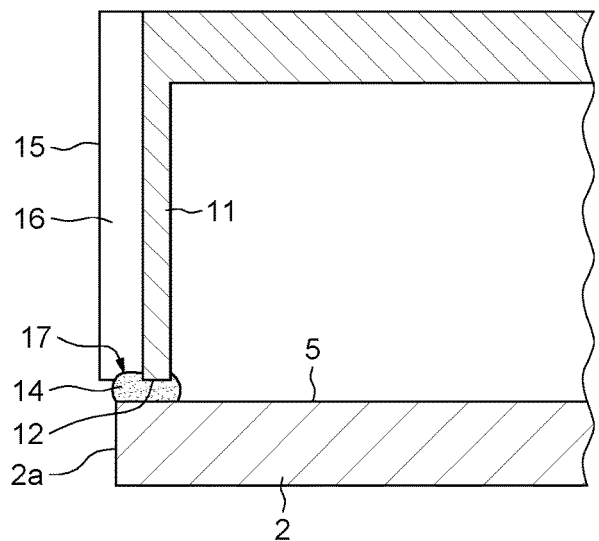
FIG. 3 represents a transverse local cross section, according to of a variant embodiment of the package of FIG. 1.

FIGS. 1 to 3 illustrate a package 1 which comprises a support plate 2, made of a dielectric material, including an integrated array of electrical connections 3 and having a rear face 4 and a front mounting face 5. The peripheral outline of the support plate 2 is, for example, square or rectangular.

The package 1 comprises an electronic integrated circuit chip 6 mounted on top of the front face 5 of the support plate 2, via a layer of glue 7, or any other layer such as an adhesive, inserted between the front face 5 of the support plate 2 and a rear face 6a of the chip 6. The perimeter of the electronic integrated circuit chip 6 is at a distance from the periphery of the support plate 2.

The electronic integrated circuit chip 6 is linked electrically to the array of connections 3 via electrical connection wires 8 linking bump contacts of the front face 5 of the support plate 2 and bump contacts of the front face 6b of the electronic integrated circuit chip 6, the rear face 4 of the support plate 2 being provided with electrical connection bump contacts for external electrical connections of the array of connections 3.

The package 1 comprises an encapsulation cap 9 for the electronic integrated circuit chip 6 and electrical connection wires 8 in front of the support plate 2.

The encapsulation cap 9 is in the form of a cup and comprises a front wall 10 situated on top of and at a distance from the electronic integrated circuit chip 6, parallel to the support plate 2, and a peripheral wall 11 which extends towards the rear from the front wall 10 and whose end edge 12 is adjacent and parallel to a peripheral zone of the front face 5 of the support plate 2.

Thus, the support plate 2 and the encapsulation cap 9 delimit a chamber 13 inside which the electronic integrated circuit chip 6 and the electrical connection wires 8 are situated.

The encapsulation cap 9 is fixed onto the support plate 2 via a bead of glue 14 inserted between the end edge 12 of the peripheral wall 11 and the peripheral zone of the front face 5 of the support plate 2.

The peripheral or lateral face 15 of the peripheral wall 11 corresponds substantially to the outline 2a of the support plate 2.

According to the example represented, the peripheral or lateral face 15 of the peripheral wall 11 is situated beyond the peripheral edge of the support plate 2, such that the end edge 12 of the peripheral wall 11 has an outer part situated beyond the peripheral edge of the support plate 2 and an inner part facing the peripheral zone of the front face 5 of the support plate 2 and placed on the bead of glue 14.

The peripheral or lateral face 15 of the encapsulation cap 9 has, for example, two local hollowed-out recesses 16 which extend from the end edge 12 of the peripheral wall 11 and which are situated on two opposite sides of the cap, substantially in the middle of these sides. The local hollowed-out recesses 16 extend along local and limited portions of said peripheral wall in the peripheral direction of the peripheral wall.

The local hollowed-out recesses 16 have a depth which, at least in the end part of the peripheral wall 11, lies between the thickness corresponding to the abovementioned outer part of the end edge 12 of the peripheral wall 11 and the total thickness of the peripheral wall 11, such that the local hollowed-out recesses 16 have at least a part facing a local part of the peripheral zone of the front face 5 of the support plate 2 and that thus the local hollowed-out recesses 16 locally uncover, at two points 17, the bead of glue 14, in a local portion of the bead of glue in the peripheral direction of the peripheral wall 11. Thus, the thickness of the peripheral wall 11 and the width of the front face 12 of the peripheral wall 11 are reduced only at the location of the local hollowed-out recesses 16. In consequence, the strength of the fixation of the cap 9 on the support plate 2 through the bead of glue 14 is not affected.

The local hollowed-out recesses 16 extend over all the height of the peripheral face 15 of the encapsulation cap 9 and are of constant cross-sections.

Figure 4:
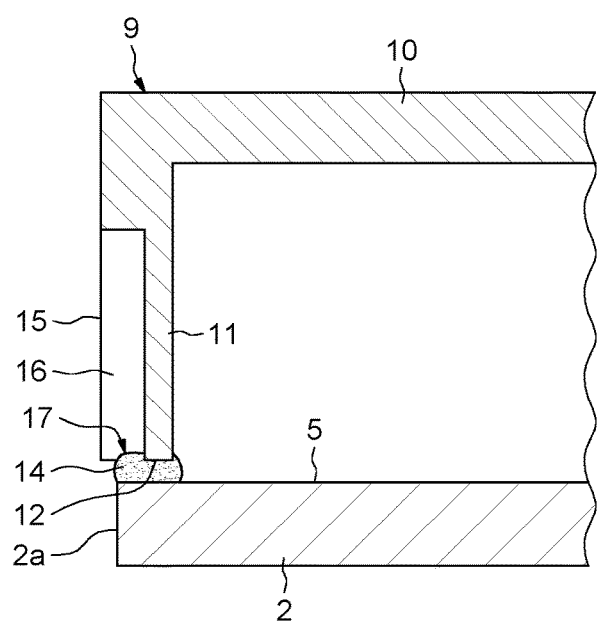
FIG. 4 represents a transverse local cross section, according to of another variant embodiment of the package of FIG. 1.

Nevertheless, according to another variant embodiment illustrated in FIG. 4, the local hollowed-out recesses 16 extend over a part of the height of the peripheral face 15 of the encapsulation cap 9 from the end edge 12 of the peripheral wall 11 and are of constant cross-sections.

The package 1 can be fabricated by carrying out the following operations.

The support plate 2, previously provided with the electronic integrated circuit chip 6 and electrical connection wires 8, is placed on a transport plate 18 (represented by dotted lines in FIG. 2), by inserting a film onto which the rear face 4 of the support plate 2 is temporarily glued.

Using a syringe, a bead of glue 14 is deposited, in the liquid state, over the peripheral zone of the front face of the support plate 2.

Advantageously, the glue chosen is capable of hardening by polymerization under the effect of an ultraviolet light radiation and heat.

Next, using a transfer and holding tool (commonly referred to by the term "pick & place"), for example suction-based, the encapsulation cap 9 is placed in the position described previously. That done, the end edge 12 of the peripheral wall 11 of the encapsulation cap 9 is pressed into the bead of glue 14, so that, in particular, glue rises in the lower part of the local hollowed-out recesses 16, in contact with the faces of these recesses 16.

With the transfer and holding tool being equipped with a device suitable for emitting an ultraviolet light radiation, this emission is activated temporarily towards the local points 17 of the bead of glue 14, via the local hollowed-out recesses 16, directly or obliquely, so as to locally harden, at least partially, the bead of glue 14 in the local points 17 and induce local securings of the encapsulation cap 9 on the support plate 2 at these points 17.

After which, the transfer and holding tool is removed.

Next, the transport plate 18 is transferred into a bake oven, forming a second equipment item, so as to completely harden, at a suitable temperature, the bead of glue 14 in order to induce a definitive fixing of the encapsulation cap 9 on the support plate 2.

Finally, the package 1 obtained is separated from the temporary gluing film of the transport plate 18.

During the transportation of the transport plate 18 between the encapsulation cap 9 placement station and the station for definitive fixing of the encapsulation cap 9 on the support plate 2 in the oven, or during any other procedures between the placement and definitive fixing of the encapsulation cap 9 in the oven, the encapsulation cap 9 retains its position in relation to the support plate 2 by virtue of the existence of the hardened local points 17 of the bead of glue 14.

In a particular embodiment illustrated in FIGS. 1 and 2, the electronic integrated circuit chip 6 comprises, in its front face 6b, an optical element 20, for example an optical sensor or an optical emitter, and the front wall 10 of the encapsulation cap 9 is provided, corresponding with a through passage 21 of this front wall, with an optical member 22 allowing light to pass, for example an optical lens, situated facing the optical element 20 of the electronic integrated circuit chip 6.

By virtue of the existence of the hardened local points 17 of the bead of glue 14, the optical alignment of the optical member 22 borne by the encapsulation cap 9 in relation to the optical element 20 of the electronic integrated circuit chip 6, produced during the placement of the encapsulation cap 9 on the support plate 2, can be retained until definitive fixing.

Considering a collective fabrication of a plurality of packages 1, a plurality of support plates 2, equipped with electronic integrated circuit chips 6 and electrical connection wires 8, is placed on a transport plate 18, at a distance from one another, then beads of glue 14 are deposited respectively on the support plates 2.

Next, in succession, using the transfer and holding tool, an encapsulation cap 9 is placed on each support plate 2 and then a local hardening is induced at the local points 17 of the bead of glue 14.

With the support plates 2 respectively equipped with the encapsulation caps 9, the transport plate 18 is transferred into a bake oven, so as to completely harden, at a determined temperature, the beads of glue 14 in order to induce a definitive fixing of the encapsulation caps 9 on the support plates 2.

FIGS. 5 and 6 illustrate a package 101 which, in a way equivalent to the package 1, comprises a support plate 102 including an array of electrical connections 103 and an encapsulation cap 104 which has a front wall 105 and a peripheral wall 106 of which an end edge 107 is fixed onto a peripheral zone of a front face 108 of the support plate 102, via a bead of glue 109, so as to delimit a chamber 110.

This time, an electronic integrated circuit chip 111 is fixed onto the front face 108 of the support plate 102, this electronic integrated circuit chip 111 comprising, in its front face 111*a*, two optical sensors 112 and 113.

This time, the encapsulation cap 104 comprises an internal separating partition 114, protruding from the front wall 105 and joining two opposite sides of the peripheral wall 106.

The internal separation partition 114 divides the chamber 110 into two cavities 115 and 116 and straddles the electronic integrated circuit chip 111, at a point such that the sensors 112 and 113 are situated respectively on one side and on the other and at a distance from the internal separation partition 114, inside the cavities 115 and 116.

The internal separation partition 114 has a rear edge 114*a* provided with a notch passed through by the electronic integrated circuit chip 111, this rear edge 114*a* being fixed on one side to zones of the front face 108 of the support plate 102 situated on either side of the electronic integrated circuit chip 111 and on the other side onto zones of the front face 111*a* and flanks of the electronic integrated circuit chip 111, via a bead of glue 117. Thus, the internal separation partition 114 divides the chamber 110 into two optically separated cavities 115 and 116.

Inside the cavity 116, an electronic integrated circuit chip 118 is installed, glued onto the front face 108 of the support plate 102, alongside the chip 111. The electronic integrated circuit chip 118 comprises, in its front face 118*a*, an emitter of light radiations 119 and is linked to the array of electrical connections 3 by electrical connection wires 120. The support plate 102, the encapsulation cap 104, the bead of glue 109 and the bead of glue 117 are made of opaque materials.

The front wall 105 of the encapsulation cap 104 has through orifices 121 and 122 which are blocked by optical elements 123 and 124 allowing light to pass, associated respectively with the cavities 115 and 116. The optical elements 123 and 124 can be added by gluing onto the prefabricated cap 104, or be inserted by overmolding of the cap 104.

The emitter 119 of the electronic integrated circuit chip 118 emits a light radiation, for example infrared, outward through the optical element 124. This light radiation present in the cavity 116 is picked up by the sensor 113 of the electronic integrated circuit chip 111. The sensor 112 of the electronic integrated circuit chip 111 picks up the external light radiation through the optical element 123 which can be an infrared filter possibly forming an optical lens for focussing light towards the sensor 112. The electronic package 1 can constitute a body proximity detection means based on a processing of the signals from the sensors 112 and 113.

For example, in a way equivalent to the package 1, the peripheral outer or lateral face 125 of the encapsulation cap 104 is situated beyond the peripheral edge 126 of the support plate 104.

The peripheral outer or lateral face 125 of the encapsulation cap 104 has local recesses 127 which, this time, are formed in the four corners of the encapsulation cap 104, these local recesses being flat or hollowed out.

In a way equivalent to the hollowed-out recesses 16 of the package 1, the hollowed-out recesses 127 extend from the end edge 107 of the peripheral wall 106 and are situated facing portions of the corners of the front face 108 of the support plate 102, so as to uncover local points 128 of the bead of glue 109.

The package 101 can be fabricated in a way equivalent to the package 1.

The support plate 2, previously provided with the electronic integrated circuit chips 111 and 118 and electrical connection wires, is placed on a transport plate 18 (not represented in FIGS. 5 and 6).

Using a syringe, beads of glue 109 and 117, in the liquid state, are deposited over the peripheral zone of the front face 108 of the support plate 2 and over the electronic integrated circuit chip 111.

Next, using a transfer and holding tool, for example suction-based, the encapsulation cap 104, previously provided with the optical elements 123 and 124 in the position described previously, is placed. That done, the end edge 107 of the peripheral wall 106 of the encapsulation cap 104 is pressed into the bead of glue 109, so that, in particular, the glue rises in the lower part of the local hollowed-out recesses 127, in contact with the faces of these recesses 127.

With the transfer and holding tool being equipped with a suitable device for emitting an ultraviolet light radiation, this emission is temporarily activated towards the local points 128 of the bead of glue 109, via the local hollowed-out recesses 127, directly or obliquely, so as to locally harden, at least partially, the bead of glue 119 in the local points 128 and induce local securings of the encapsulation cap 104 on the support plate 102 at these points 128. After which, the transfer and holding tool is removed.

Next, the transport plate 18 is transferred into a bake oven so as to completely harden, at a suitable temperature, the beads of glue 109 and 117 in order to induce a definitive fixing of the encapsulation cap 104 on the support plate 102 and on the electronic integrated circuit chip 111.

Finally, the package 1 obtained is separated from the transport plate 18.

In a way equivalent to the example described previously, during the transportation of the transport plate 18 between the encapsulation cap 104 placement station and the station for definitive fixing of the encapsulation cap 104 on the support plate 102 in the oven, or during any other procedures between the placement and the definitive fixing of the encapsulation cap 104, the encapsulation cap 104 retains its position in relation to the support plate 102 by virtue of the existence of the hardened local points 127 of the bead of glue 109.

More particularly, the optical alignment, in particular of the optical member 123 borne by the encapsulation cap 104 in relation to the optical element 112 of the electronic integrated circuit chip 6, produced during the step of placement of the encapsulation cap 9 on the support plate 2, can be retained until definitive fixing.

In a way equivalent to what has been described previously with respect to the package 1, the package 101 can also result from a collective fabrication, hardening the points 128 of the beads of glue during the placement of the encapsulation caps 104, in succession, on the support plates 102.

According to a variant embodiment, the peripheral beads of glue 14 and 109 could be interrupted so as to allow the production of vents.

According to yet another variant embodiment, not illustrated in FIGS. 1 and 2, the optical member 22 of the package 1 can be mounted on the encapsulation package 9 after the operation of fixing of said encapsulation package 9 on the support plate 2 by localized hardening of the bead of glue 14, and this can be done without leaving the transfer and holding (pick and place) tool. The fixing of said optical member 22 on said encapsulation package 9 can be done, for example, using a second bead of glue disposed on the front wall 10 of the encapsulation cap 9.

Thus, the placement of the optical member 22 on the package 1 can be done without adding an extra error of alignment in relation to the optical element 20 of the electronic integrated circuit chip 6, unlike the case where the optical member 22 would be mounted on the encapsulation package 9 after definitive fixing of said encapsulation package on the support plate 2 by passage into a bake oven, in which case a second transfer/holding operation would be necessary to align and mount the optical member 22 on the front wall 10 of the encapsulation package 9. The accuracy of the alignment of the optical member 22 with respect to the optical element 20 of the electronic integrated circuit chip 6 is thus enhanced.

Similarly, according to a variant not illustrated in FIGS. 5 and 6, at least one of the optical members 123 or 124 can be mounted and fixed onto the package 101 during the same transfer/holding (pick and place) operation as that used to mount the package 101 on the support plate 102, thus reducing the error of alignment between said optical member 123 or 124 and the corresponding emitter of light rays 119 or optical sensor 112.

The invention claimed is:

1. A package, comprising:
    a support plate having a front face;
    an electronic integrated circuit chip mounted on the front face of the support plate;
    an encapsulation cap comprising a front wall extending in front of the electronic integrated circuit chip and a peripheral wall having an end edge at least partly facing a peripheral zone of the support plate, the support plate and the encapsulation cap delimiting at least one chamber in which the electronic integrated circuit chip is situated; and
    at least one bead of glue inserted between said peripheral zone of the support plate and said end edge of the peripheral wall of the encapsulation cap;
    wherein the peripheral outer face of said encapsulation cap has at least one local hollowed-out recess extending from said end edge and only partially along at a local and limited portion of said peripheral wall in the peripheral direction of the peripheral wall, said at least one local recess locally uncovering said bead of glue in a local portion of the bead of glue in the peripheral direction of the peripheral wall.

2. The package according to claim 1, wherein said local hollowed-out recess extends over all of a height of said peripheral wall along the outer face of said encapsulation cap.

3. The package according to claim 1, wherein said local hollowed-out recess extends over only a part of a height of said peripheral wall along the outer face of said encapsulation cap.

4. The package according to claim 1, wherein the outer face of said encapsulation cap has at least two local hollowed-out recesses in the peripheral wall situated on opposite sides of the encapsulation cap from one another.

5. The package according to claim 1, wherein the outer face of said encapsulation cap has at least two local hollowed-out recesses in the peripheral wall situated at corners of the encapsulation cap.

6. The package according to claim 1, wherein the outer face of said encapsulation cap is situated beyond a peripheral edge of the support plate.

7. The package according to claim 1, wherein a front face of the electronic integrated circuit chip has at least one optical member and the front wall of the encapsulation cap has a through passage provided with an optical element capable of being passed through by light.

8. A method for fabricating a package which includes a support plate, an encapsulation cap having a front wall and a peripheral wall with at least one local recess on an outer surface and at least one electronic integrated circuit chip, the method comprising the following steps:
    fixing said electronic integrated circuit chip onto a front face of said support plate;
    depositing a bead of glue over at least a part of a peripheral zone of said front face of the support plate;
    placing said encapsulation cap on top of the front face of said support plate in a position such that an end edge of said peripheral wall is placed at least partly on said bead of glue and at least one local point of said bead of glue is uncovered at said at least one local recess;
    locally hardening a first portion of the bead of glue by a first hardening process, said first portion positioned at the at least one local point where local recess is located; and
    hardening a second portion of the bead of glue different from the first portion by a second hardening process that is performed after completion of the first hardening process.

9. The method according to claim 8, wherein a peripheral face of the encapsulation cap includes said at least one local recess extending from said end edge.

10. The method according to claim 8, wherein said glue is configured for hardening under an effect of a light radiation and is configured for hardening under an effect of a heat application.

11. The method of claim 10, wherein the first hardening process is light radiation and the second hardening process is heat application.

12. The method of claim 11, wherein locally hardening comprises emitting the light radiation towards the at least one local point where local recess is located and wherein hardening comprises baking in an oven.

13. The method according to claim 8, wherein placing comprises using transfer and holding tool to position said encapsulation cap on top of said support plate.

14. The method according to claim 13, wherein said transfer and holding tool includes a hardening equipment configured for performing said locally hardening.

15. A package, comprising:
    a support plate having a front face;
    an electronic integrated circuit chip mounted on the front face of the support plate;
    an encapsulation cap comprising a front wall extending in front of the electronic integrated circuit chip and a peripheral wall having an outer surface and having an end edge that extends parallel to the front face of the support plate, the support plate and the encapsulation cap delimiting at least one chamber in which the electronic integrated circuit chip is situated;
    a bead of glue inserted between said end edge of the peripheral wall of the encapsulation cap and the front face of the support plate;
    wherein a first portion of the end edge of the peripheral wall has a first thickness and wherein a second portion of the end edge of the peripheral wall has a second thickness that is less than the first thickness, said second thickness defined by a local hollowed-out recess present in the outer surface of the peripheral wall, said local hollowed-out recess uncovering a local portion of the bead of glue.

16. The package according to claim 15, wherein said local hollowed-out recess extends over all of a height of the outer surface of said peripheral wall.

17. The package according to claim 15, wherein said local hollowed-out recess extends over only a part of a height of the outer surface of said peripheral wall.

18. The package according to claim 15, wherein the outer face of said encapsulation cap has at least two local hollowed-out recesses in the outer surface of said peripheral wall situated on opposite sides of the encapsulation cap from one another.

19. The package according to claim 15, wherein the outer face of said encapsulation cap has at least two local hollowed-out recesses in the outer surface of said peripheral wall situated at corners of the encapsulation cap.

20. The package according to claim 15, wherein the outer surface of said encapsulation cap is situated beyond a peripheral edge of the support plate.

21. The package according to claim 15, wherein a front face of the electronic integrated circuit chip has at least one optical member and the front wall of the encapsulation cap has a through passage provided with an optical element capable of being passed through by light.

\* \* \* \* \*